United States Patent
Ho et al.

(10) Patent No.: US 8,189,357 B2
(45) Date of Patent: May 29, 2012

(54) MEMORY WITH MULTIPLE REFERENCE CELLS

(75) Inventors: Hsin-Yi Ho, Hsinchu (TW); Chia-Ching Li, Taipei County (TW)

(73) Assignee: Macronix International Co., Ltd., Hsinchu (TW)

( * ) Notice: Subject to any disclaimer, the term of this patent is extended or adjusted under 35 U.S.C. 154(b) by 111 days.

(21) Appl. No.: 12/555,872

(22) Filed: Sep. 9, 2009

(65) Prior Publication Data

US 2011/0058414 A1   Mar. 10, 2011

(51) Int. Cl.
*G11C 11/34* (2006.01)
(52) U.S. Cl. ............ 365/2; 365/3; 365/21; 365/22
(58) Field of Classification Search ............ 365/185.2
See application file for complete search history.

(56) References Cited

U.S. PATENT DOCUMENTS

| 7,639,542 | B2 * | 12/2009 | Cornwell et al. | 365/185.2 |
| 7,808,830 | B2 * | 10/2010 | Kasuta | 365/185.2 |
| 2007/0236999 | A1 * | 10/2007 | Honda | 365/185.21 |

* cited by examiner

*Primary Examiner* — Hoai V Ho
*Assistant Examiner* — Min Huang
(74) *Attorney, Agent, or Firm* — Thomas|Kayden

(57) ABSTRACT

A memory includes a memory array, a sense amplifier, and a reference circuit. The memory array includes a memory cell. The sense amplifier includes a first terminal coupled to the memory cell and a second terminal. The reference circuit includes a first reference cell, a second reference cell, and a switch. The first reference cell has a first reference threshold voltage for providing a first reference current, based on a first reference word line voltage. The second reference cell has a second reference threshold voltage for providing a second reference current, based on a second reference word line voltage. The switch selectively provides one of the first and the second reference currents to the second terminal in response to a control signal. The first and the second reference word line voltages correspond to different voltage levels.

22 Claims, 2 Drawing Sheets

MEMORY WITH MULTIPLE REFERENCE CELLS

BACKGROUND OF THE INVENTION

1. Field of the Invention

The invention relates in general to a memory, and more particularly to a memory capable of reducing sense window loss of sense currents due to temperature effect on threshold voltage of memory cells. The memory cells are the two-bit Nitride-based trapping storage flash cells

2. Description of the Related Art

Non-volatile memory, such as flash memory, is widely used in various electronic products. Referring to FIG. 1, an illustration of a programmed threshold voltages distributions of a memory is shown. For example, the flash memory is a memory with multiple level cells (MLCS), which can be programmed to have four threshold voltage distributions shown as curves d1-d4 corresponding to two bits of data stored in each of the MLC. In a read operation of a selected MLC, the selected MLC has to be read with three different word line voltages to obtain three cell currents accordingly. For example, the three different word line voltages have the respective levels V1, V2, and V3. The three cell currents will be compared with a reference current, so as to obtain the data stored in the MLC.

In real cases, the threshold voltages of MLCS will be varied due to temperature effect. To be more specific, the MLCS will suffer from descents of threshold voltage when the surrounding temperature is raised and the amounts of descents are proportional to the levels of the threshold voltage. For example, the four threshold voltage distributions of MLCS in the memory can be shown as curves d1'-d4'. Thus, MLCS in the memory will suffer from read window loss due to the raised threshold voltages of the MLCS when the surrounding temperature is raised.

SUMMARY OF THE INVENTION

The invention is directed to a memory with multiple level cells (MLCS). The memory employs a number of reference cells with reference threshold voltages having similar threshold voltage variations resulting from the temperature effect as a threshold voltage of a read memory cell. Thus, the reference currents and the read windows determined by the reference currents can be altered according to the threshold voltage variations due to the temperature effect. Consequently, in comparison with the conventional memory, the memory related to the invention can effectively prevent the read window loss due to the temperature effect.

According to a first aspect of the present invention, a memory is provided. The memory includes a memory array, a sense amplifier, and a reference circuit. The memory array includes a memory cell. The sense amplifier includes a first terminal coupled to the memory cell and a second terminal. The reference circuit includes a first reference cell, a second reference cell, and a switch. The first reference cell has a first reference threshold voltage for providing a first reference current, based on a first reference word line voltage. The second reference cell has a second reference threshold voltage for providing a second reference current, based on a second reference word line voltage. The switch selectively provides one of the first and the second reference currents to the second terminal in response to a control signal. The first and the second reference word line voltages correspond to different voltage levels.

According to a second aspect of the present invention, a memory is provided. The memory includes a memory array, a sense means, and a reference means. The memory array includes a memory cell. The sense means includes a first terminal, coupled to the memory cell, and a second terminal. The reference means comprises first current means, second current means, and a switch means. The first current means, referring to a first reference threshold voltage, provides a first reference current based on a first reference word line voltage. The second current means, referring to a second reference threshold voltage, provides a second reference current based on a second reference word line voltage. The switch means selectively provides one of the first and the second reference currents to the second terminal in response to a control signal. The first and the second reference word line voltages correspond to different voltage levels.

The invention will become apparent from the following detailed description of the preferred but non-limiting embodiments. The following description is made with reference to the accompanying drawings.

DETAILED DESCRIPTION OF THE INVENTION

The memory according to an embodiment of the invention employs a number of reference cells with reference threshold voltages having similar threshold voltage variations resulting from the temperature effect as the threshold voltage of the read memory cell.

Figure 1:
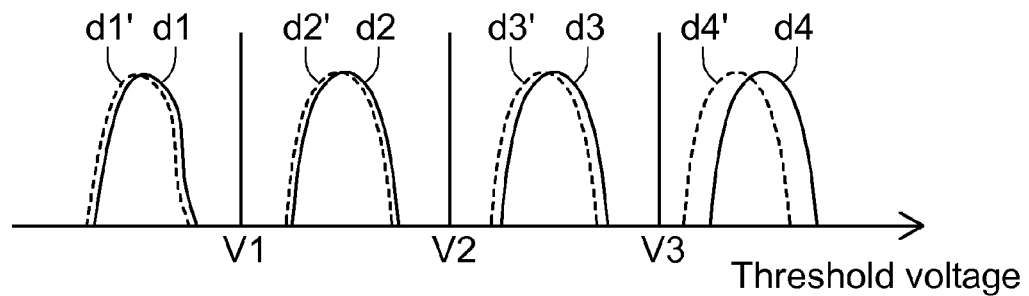
FIG. 1 (Prior art) is an illustration of a programmed threshold voltages distributions of a memory
Figure 2:
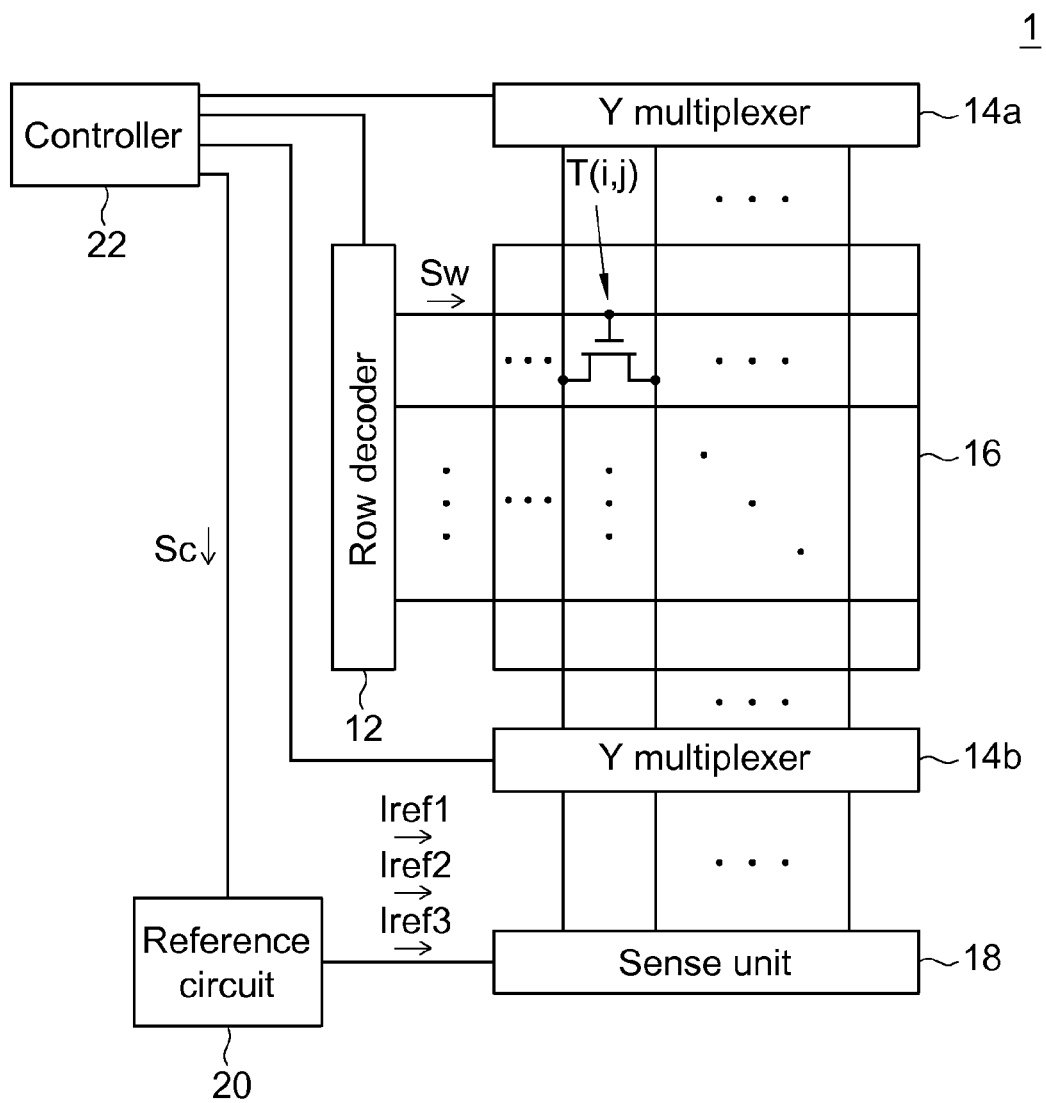
FIG. 2 is a block diagram of the memory according to an embodiment of the invention.

Referring to FIG. 2, a block diagram of the memory according to the embodiment of the invention is shown. The memory 1 is a MLC memory including a row decoder 12, Y multiplexers 14a and 14b, a memory cell array 16, a sense unit 18, a reference circuit 20, and a controller 22. The memory cell array 16 includes numerous memory cells arranged in an M×N matrix, wherein M and N are natural numbers greater than 1.

Figure 3:
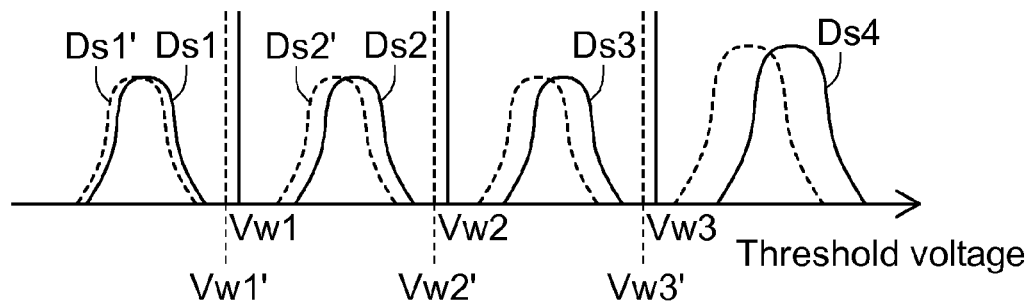
FIG. 3 is an illustration of a programmed threshold voltages distribution of a memory.

Referring to FIG. 3, an illustration of a programmed threshold voltages distribution of a memory is shown. For example, each of the memory cells, which initially has a first state, can be programmed to have three other threshold voltage states indicating the values of two bits of data stored in each of the memory cells. Thus, the memory cells with the first state and programmed with the three other states form the respective four threshold voltage distributions plotted as curves Ds1, Ds2, Ds3, and Ds4. For example, the curves Ds1 to Ds4 indicate the threshold voltage distributions when the surrounding temperature of the memory 1 is at a first temperature.

The row decoder 12 and the Y multiplexer 14a provide the corresponding word line voltages and bias voltages to at least a selected memory cell, so as to drive the memory cells providing cell currents. The Y multiplexer 14b provides the cell current of the selected memory cell to the sense unit 18 so as to sense the data stored in the selected memory cell. For example, the selected memory cell is the memory cell T(i,j)

with the coordinates (i,j) in the memory cell array 16, wherein i and j are natural numbers less than or equal to M and N, respectively.

Because the threshold voltages of memory cells can be programmed with more than two states, it can be obtained that more than one sense operations must be applied in a read operation to effectively obtain the threshold voltage state of a read memory cell and the data stored therein. For example, in order to obtain the data stored in the memory cell, the controller 22 controls the operation of the row decoder 12 and the Y multiplexers 14a and 14b to read the memory cell T(i,j) with a word line voltage Sw having different levels in different read operations.

In an example, the word line voltage Sw respectively has the levels Vw1, Vw2, and Vw3 in a first read operation, in a second read operation, and in a third read operation. Thus, in the first to the third read operations, the threshold voltage state of the memory cell T(i,j) and whether the threshold voltage of the memory cell T(i,j) is greater than the level Vw1, the level Vw2, and the level Vw3 can be effectively determined.

Figure 4:
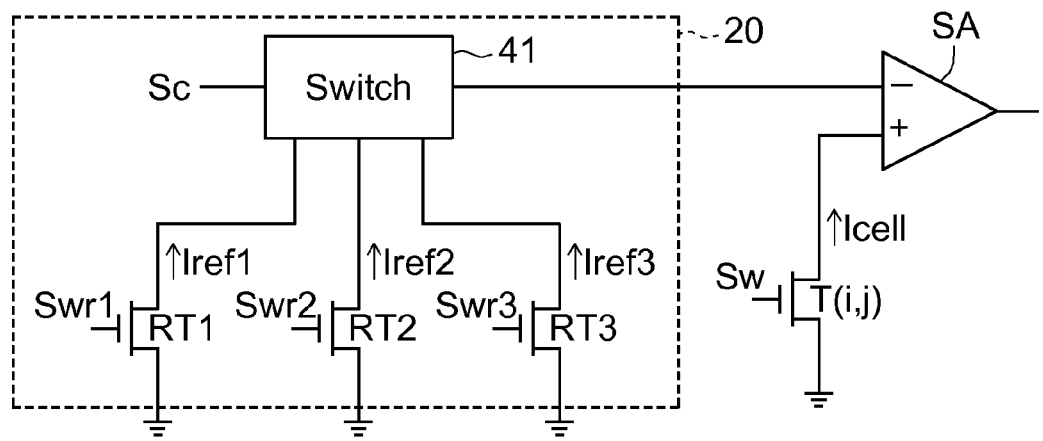
FIG. 4 is a detailed block diagram of a sense amplifier in the sense unit 18 and the reference circuit 20.

Referring to FIG. 4, a detailed block diagram of a sense amplifier in the sense unit 18 and the reference circuit 20 is shown. For example, a sense amplifier SA included in the sense unit 18 is for sensing a cell current Icell provided by the memory cell T(i,j). The sense amplifier SA includes a first terminal coupled to the memory cell T(i,j) for receiving the cell current Icell and a second terminal coupled to the reference circuit 20 for receiving reference currents.

The reference circuit 20 includes a switch 41 and reference cells RT1, RT2, and RT3. The reference cells RT1 to RT3 are respectively programmed to reference threshold voltages Vthr1, Vthr2, and Vthr3. The reference cells RT1-RT3 respectively provide a reference current Iref1 based on a reference word line voltage Swr1 and the reference threshold voltage Vthr1, a reference current Iref2 based on a reference word line voltage Swr2 and the reference threshold voltage Vthr2, and a reference current Iref3 based on a reference word line voltage Swr3 and the reference threshold voltage Vthr3. For example, the reference word line voltages Swr1 to Swr3 respectively have the levels Vw1 to Vw3 and the reference threshold voltages Vthr1 to Vthr3 respectively have the levels Vw1 to Vw3.

In response to a control signal Sc provided by the controller 22, the switch 41 selectively provides one of the reference currents Iref1, Iref2, and Iref3 to the second terminal of the sense amplifier SA, e.g., in the first to the third read operations respectively. In other words, reference currents Iref1 to Iref3 are employed by the sense amplifier SA as the reference current in the first to the third read operations, respectively. For example, when the controller 22 controls the operation to read the memory cell T(i,j) with the word line voltage having the level Vw1, the switch 41 is controlled by the controller 22 to select the reference current Iref1 as the reference current. In other words, when the controller 22 controls the operation to determine whether the memory cell T(i,j) belongs to the distributions Ds1 or Ds2, it is the reference current Iref1 being selected.

When the controller 22 controls the operation to read the memory cell T(i,j) with the word line voltage having the levels Vw2 and Vw3, the switch 41 is controlled by the controller 22 to respectively select the reference currents Iref2 and Iref3 as the reference current. In other words, the reference currents Iref2 and Iref3 are respectively selected by the switch 41 when the controller 22 determines whether the memory cell T(i,j) belongs to the distributions Ds2 or Ds3 and belongs to the distributions Ds3 or Ds4.

When the threshold voltage of the memory cell T(i,j) is programmed with threshold voltage less than the level Vw2 (i.e. the memory cell T(i,j) has the threshold voltage distributions as indicated by the curves Ds1 or Ds2 in FIG. 3), the level of threshold voltage of the memory cell T(i,j) is close to the level of the reference threshold voltage Vthr1 (i.e. the level Vw1). In addition, the threshold voltage variations of a memory cell due to the temperature effect are proportional to the threshold voltage level and threshold voltages with similar threshold voltage level correspond to similar threshold voltage variations. Thus, when the threshold voltage of the memory cell T(i,j) varies due to the temperature effect, the reference threshold voltage Vthr1 will have a similar threshold voltage variation and the reference current Iref1 will have a similar variation as the cell current Icell.

For example, when the reference threshold voltage Vthr1 is varied from the level of Vw1 to Vw1' at a second temperature, the curves Ds1 and Ds2 representing the threshold voltage distributions are shifted to the left as indicated by the curves Ds1' and Ds2'. The reference threshold voltage Vthr1 having the level Vw1 at the first temperature will shift left to the level Vw1' at the second temperature. In addition, the reference threshold voltage Vthr1 serves as the threshold condition between the threshold voltage distributions shown as the curves Ds1 and Ds2. Consequently, the read window loss due to the temperature effect can be effectively recovered.

When the threshold voltage of the memory cell T(i,j) is programmed with threshold voltage less than the level Vw3 but greater than the level Vw1 (i.e. the memory cell T(i,j) is in the threshold voltage distributions plotted as Ds2 or Ds3) and with threshold voltage greater than Vw2 (i.e. the memory cell T(i,j) is in the threshold voltage distribution plotted as Ds3 or Ds4), similar threshold voltage variations will take place on the reference threshold voltages Vthr2 and Vthr3 for respectively varied as levels Vw2' and Vw3'. The reference threshold voltages Vthr2 and Vthr3, which respectively have the levels Vw2 and Vw3 at the first temperature, will respectively shift left to the levels Vw2' and Vw3' at the second temperature. In addition, the reference threshold voltages Vthr2 serves as the threshold condition between the threshold voltage distributions shown as the curves Ds2 and Ds3, and the reference threshold voltage Vthr3 serves as the threshold condition between the threshold voltage distributions shown as the curves Ds3 and Ds4. Consequently, the read window loss due to the temperature effect can be effectively recovered.

The memory according to the present embodiment of the invention is a memory with MLCS. The memory employs a number of reference cells with reference threshold voltages having similar threshold voltage variations resulting from the temperature effect as the threshold voltage of the read memory cell. Thus, the reference currents and the read windows determined by the reference currents can be altered accordingly with the threshold voltage variations due to the temperature effect. Consequently, the memory according to the present embodiment of the invention is advantageously capable of effectively preventing the read window loss due to the temperature effect.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory comprising:
    a memory array comprising a memory cell;
    a sense amplifier comprising a first terminal, coupled to the memory cell, and a second terminal; and
    a reference circuit comprising:
        a first reference cell having a first reference threshold voltage for providing a first reference current, based on a first reference word line voltage, when the memory cell is read with a word line voltage;
        a second reference cell having a second reference threshold voltage for providing a second reference current, based on a second reference word line voltage, when the memory cell is read with the word line voltage; and
        a switch for selectively providing one of the first and the second reference currents to the second terminal in response to a control signal,
    wherein the first and the second reference word line voltages correspond to different voltage levels;
    wherein when a threshold voltage of the memory cell and the first reference threshold voltage correspond to a similar first voltage level, the threshold voltage of the memory cell and the first reference threshold voltage correspond to substantially a same threshold voltage variation of temperature effect and a cell current of the memory cell and the first reference current correspond to substantially a same current variation of temperature effect; and
    wherein when the threshold voltage of the memory cell and the second reference threshold voltage correspond to a similar second voltage level, the threshold voltage of the memory cell and the second reference threshold voltage correspond to substantially a same threshold voltage variation of temperature effect and the cell current of the memory cell and the second reference current correspond to substantially a same current variation of temperature effect.

2. The memory according to claim 1, further comprising:
    a third reference cell having a third reference threshold voltage for providing a third reference current, based on a third reference word line voltage, when the memory cell is read with the word line voltage, wherein:
        the first to the third reference word line voltages correspond to different voltage levels; and
        the switch selectively provides one of the first to third reference currents to the second terminal based on the control signal.

3. The memory according to claim 2, wherein the memory cell is a multiple level cell (MLC), which initially has a first state and can be programmed to have a second state, a third state, and a fourth state, corresponding to data stored in the memory cell.

4. The memory according to claim 3, further comprising:
    a read controller for reading the memory cell with a first word line voltage in a first read operation, reading the memory cell with a second word line voltage in a second read operation, and reading the memory cell with a third word line voltage in a third read operation, so as to obtain the data stored in the memory cell.

5. The memory according to claim 4, wherein the first to third word line voltages are substantially the same as the first to the third reference word line voltages, respectively.

6. The memory according to claim 4, wherein the read controller further provides the control signal to control the switch providing the first to the third reference currents to the second terminal in the first to the third read operations, respectively.

7. The memory according to claim 3, wherein the first to the third reference currents respectively serve to distinguish from respective threshold conditions between the first and the second states, the second and the third states, and the third and the fourth states.

8. The memory according to claim 7, wherein when a threshold voltage of the memory cell is less than the first reference threshold voltage, the memory cell is determined to be in the first state.

9. The memory according to claim 7, wherein when a threshold voltage of the memory cell is greater than the first reference threshold voltage but less than the second reference threshold voltage, the memory cell is determined to be programmed in the second state.

10. The memory according to claim 7, wherein when a threshold voltage of the memory cell is greater than the second reference threshold voltage but less than the third reference threshold voltage, the memory cell is determined to be programmed in the third state.

11. The memory according to claim 7, wherein when a threshold voltage of the memory cell is greater than the third reference threshold voltage, the memory cell is determined to be programmed in the fourth state.

12. A memory comprising:
    a memory array comprising a memory cell;
    a sense means comprising a first terminal, coupled to the memory cell, and a second terminal; and
    a reference means comprising:
        a first current means, referring to a first reference threshold voltage, for providing a first reference current based on a first reference word line voltage when the memory cell is read with a word line voltage;
        a second current means, referring to a second reference threshold voltage, for providing a second reference current based on a second reference word line voltage when the memory cell is read with the word line voltage; and
        a switch means, for selectively providing one of the first and the second reference currents to the second terminal in response to a control signal,
    wherein the first and the second reference word line voltages correspond to different voltage levels;
    wherein when a threshold voltage of the memory cell and the first reference threshold voltage correspond to a similar first voltage level, the threshold voltage of the memory cell and the first reference threshold voltage correspond to substantially a same threshold voltage variation of temperature effect and a cell current of the memory cell and the first reference current correspond to substantially a same current variation of temperature effect; and
    wherein when the threshold voltage of the memory cell and the second reference threshold voltage correspond to a similar second voltage level, the threshold voltage of the memory cell and the second reference threshold voltage correspond to substantially a same threshold voltage variation of temperature effect and the cell current of the memory cell and the second reference current correspond to substantially a same current variation of temperature effect.

13. The memory according to claim 12, further comprising:
    a third current means, referring to a third reference threshold voltage, for providing a third reference current based on a third reference word line voltage when the memory cell is read with the word line voltage, wherein:

the first to the third reference word line voltages correspond to different voltage levels; and the switch means selectively provides one of the first to third reference currents to the second terminal based on the control signal.

14. The memory according to claim 12, wherein the memory cell is a multiple level cell (MLC), which initially has a first state and can be programmed to have a second state, a third state, and a fourth state, corresponding to data stored in the memory cell.

15. The memory according to claim 14, further comprising:

a control means, for reading the memory cell with a first word line voltage in a first read operation, reading the memory cell with a second word line voltage in a second read operation, and reading the memory cell with a third word line voltage in a third read operation, so as to obtain the data stored in the memory cell.

16. The memory according to claim 15, wherein the first to the third word line voltages are substantially the same as the first to the third reference word line voltages, respectively.

17. The memory according to claim 15, wherein the control means further provides the control signal to control the switch means providing the first to the third reference currents to the second terminal in the first to the third read operations, respectively.

18. The memory according to claim 14, wherein the first to the third reference currents respectively serve to distinguish from respective threshold conditions between the first and the second states, the second and the third states, and the third and the fourth states.

19. The memory according to claim 18, wherein when a threshold voltage of the memory cell is less than the first reference threshold voltage, the memory cell is determined to be in the first state.

20. The memory according to claim 18, wherein when a threshold voltage of the memory cell is greater than the first reference threshold voltage but less than the second reference threshold voltage, the memory cell is determined to be programmed in the second state.

21. The memory according to claim 18, wherein when a threshold voltage of the memory cell is greater than the second reference threshold voltage but less than the third reference threshold voltage, the memory cell is determined to be programmed in the third state.

22. The memory according to claim 18, wherein when a threshold voltage of the memory cell is greater than the third reference threshold voltage, the memory cell is determined to be programmed in the fourth state.

* * * * *